United States Patent
Damilano et al.

(10) Patent No.: US 10,103,195 B2
(45) Date of Patent: Oct. 16, 2018

(54) SEMICONDUCTING PIXEL, MATRIX OF SUCH PIXELS, SEMICONDUCTING STRUCTURE FOR THE PRODUCTION OF SUCH PIXELS AND THEIR METHODS OF FABRICATION

(71) Applicant: CENTRE NATIONAL DE LA RECHERCHE SCIENTIFIQUE, Paris (FR)

(72) Inventors: Benjamin Damilano, Nice (FR); Jean-Yves Duboz, Valbonne (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/129,679

(22) PCT Filed: Mar. 27, 2015

(86) PCT No.: PCT/EP2015/056779
§ 371 (c)(1),
(2) Date: Sep. 27, 2016

(87) PCT Pub. No.: WO2015/150281
PCT Pub. Date: Oct. 8, 2015

(65) Prior Publication Data
US 2017/0213868 A1    Jul. 27, 2017

(30) Foreign Application Priority Data

Apr. 1, 2014   (FR) .................................... 14 52876

(51) Int. Cl.
*H01L 33/00* (2010.01)
*H01L 27/15* (2006.01)
(Continued)

(52) U.S. Cl.
CPC ............ *H01L 27/156* (2013.01); *H01L 33/32* (2013.01); *H01L 33/50* (2013.01); *H01L 33/62* (2013.01);
(Continued)

(58) Field of Classification Search
None
See application file for complete search history.

(56) References Cited

U.S. PATENT DOCUMENTS 5,696,389 A * 12/1997 Ishikawa ................ B82Y 20/00
                                                      257/773
5,757,139 A *  5/1998 Forrest ..................... G09G 3/14
                                                      313/504

(Continued)

FOREIGN PATENT DOCUMENTS

EP     2 187 442 A2      5/2010
WO   WO0021143 A1 *  4/2000
WO   2010/123814 A1   10/2010

OTHER PUBLICATIONS

WO0021143, Volker, English translation. Retrieved from internet on Jan. 24, 2018 from https://patents.google.com/patent/WO2000021143A1/en?oq=wo+00%2f21143.*

*Primary Examiner* — David E Graybill
(74) *Attorney, Agent, or Firm* — Baker & Hostetler LLP

(57) ABSTRACT

A pixel comprises three adjacent sub-pixels, formed by respective stacks of semi-conducting layers wherein: each sub-pixel comprises a first active layer, adapted for emitting a light at a first wavelength when an electric current passes through it; another sub-pixel comprises a second active layer, adapted for emitting a light at a second wavelength greater than the first wavelength; another sub-pixel comprises a third active layer, adapted for emitting a light at a third wavelength greater than the first wavelength and different from the second wavelength; at least one from (Continued)

among the second and third active layers being adapted for emitting light when it is excited by the light at the first wavelength emitted by the first active layer of the same sub-pixel. Semi-conducting structure and methods for the fabrication of such a pixel are provided.

10 Claims, 5 Drawing Sheets

(51) Int. Cl.
  *H01L 33/50* (2010.01)
  *H01L 33/32* (2010.01)
  *H01L 33/62* (2010.01)

(52) U.S. Cl.
  CPC ............... *H01L 2933/0041* (2013.01); *H01L 2933/0066* (2013.01)

(56) References Cited

U.S. PATENT DOCUMENTS

| | | | | |
|---|---|---|---|---|
| 6,542,526 B1* | 4/2003 | Niwa | ............ | B82Y 20/00 |
| | | | | 372/45.01 |
| 7,361,938 B2* | 4/2008 | Mueller | ............ | C04B 35/44 |
| | | | | 257/79 |
| 7,402,831 B2* | 7/2008 | Miller | ............ | H01L 33/08 |
| | | | | 257/13 |
| 7,692,202 B2* | 4/2010 | Bensch | ............ | H01L 25/0756 |
| | | | | 257/94 |
| 7,750,564 B2* | 7/2010 | Lee | ............ | H01L 51/5262 |
| | | | | 313/506 |
| 8,058,663 B2 | 11/2011 | Fan et al. | | |
| 8,604,498 B2* | 12/2013 | Huang | ............ | H01L 27/153 |
| | | | | 257/98 |
| 8,865,493 B2* | 10/2014 | Kelley | ............ | H01L 33/08 |
| | | | | 257/E21.214 |
| 9,130,353 B2* | 9/2015 | Lell | ............ | H01S 5/4043 |
| 9,318,651 B2* | 4/2016 | Avramescu | ............ | H01L 33/06 |
| 2003/0157376 A1* | 8/2003 | Vaudo | ............ | C30B 23/00 |
| | | | | 428/698 |
| 2005/0067627 A1* | 3/2005 | Shen | ............ | H01L 33/08 |
| | | | | 257/89 |
| 2005/0269582 A1* | 12/2005 | Mueller | ............ | C04B 35/44 |
| | | | | 257/94 |
| 2006/0124917 A1* | 6/2006 | Miller | ............ | H01L 33/08 |
| | | | | 257/13 |
| 2007/0170444 A1* | 7/2007 | Cao | ............ | H01L 33/382 |
| | | | | 257/89 |
| 2008/0129191 A1* | 6/2008 | Lee | ............ | H01L 51/5262 |
| | | | | 313/504 |
| 2009/0001389 A1 | 1/2009 | Wang et al. | | |
| 2009/0078955 A1* | 3/2009 | Fan | ............ | H01L 27/15 |
| | | | | 257/98 |
| 2009/0086170 A1* | 4/2009 | El-Ghoroury | ............ | B82Y 20/00 |
| | | | | 353/38 |
| 2009/0272989 A1* | 11/2009 | Shum | ............ | H01L 27/15 |
| | | | | 257/89 |
| 2010/0034230 A1* | 2/2010 | Tamura | ............ | H01L 33/025 |
| | | | | 372/45.011 |
| 2010/0117997 A1* | 5/2010 | Haase | ............ | H01L 27/156 |
| | | | | 345/204 |
| 2011/0121319 A1* | 5/2011 | Haase | ............ | H01L 33/08 |
| | | | | 257/78 |
| 2011/0233575 A1 | 9/2011 | Huang et al. | | |
| 2011/0256648 A1 | 10/2011 | Kelley et al. | | |
| 2013/0270514 A1* | 10/2013 | Saxler | ............ | H01L 33/08 |
| | | | | 257/13 |
| 2016/0043272 A1* | 2/2016 | Damilano | ............ | H01L 33/0075 |
| | | | | 257/13 |

* cited by examiner

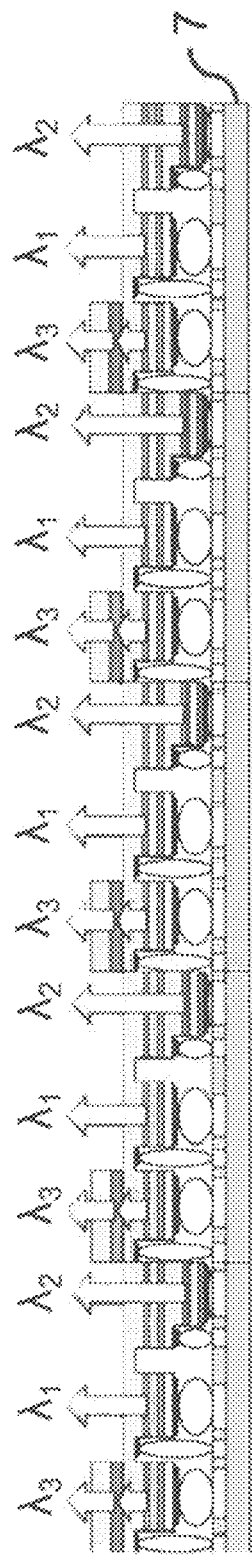

SEMICONDUCTING PIXEL, MATRIX OF SUCH PIXELS, SEMICONDUCTING STRUCTURE FOR THE PRODUCTION OF SUCH PIXELS AND THEIR METHODS OF FABRICATION

CROSS-REFERENCE TO RELATED APPLICATIONS

This application is a National Stage of International patent application PCT/EP2015/056779, filed on Mar. 27, 2015, which claims priority to foreign French patent application No. FR 1452876, filed on Apr. 1, 2014, the disclosures of which are incorporated by reference in their entirety.

FIELD OF THE INVENTION

The invention pertains to a semi-conducting pixel, in particular based on inorganic semi-conductors and more particularly based on (Al,Ga,In)N, as well as to a matrix of such pixels. The invention also pertains to semi-conducting structures serving as a basis for producing such pixels, and to methods for fabricating the latter.

The invention applies in particular to the production of miniaturized color screens and of "near the eye" projectors, as well as to lighting.

BACKGROUND

It is known to produce light-emitting devices whose color is obtained and controlled by mixing primary hues. The combination of three light-emitting diodes (LEDs) each emitting at a specific wavelength corresponding to blue, to green and to red makes it possible to obtain any color provided that the intensity ratio between each LED is well controlled. This property is particularly beneficial for fabricating screens or lamps with variable hues and intensities ("intelligent lighting"). For applications of this type, it is possible to assemble three distinct LEDs, which can if necessary be fabricated from distinct semi-conducting materials. The commonest configuration is for example to use two LEDs based on nitrides (AlInGaN) for blue and green, and a phosphide LED (AlGaInP) for red. However, the use of three different LEDs has a non-negligible cost overhead with respect to a single LED. Moreover, combining three distinct LEDs for the production of each pixel poses miniaturization problems which become insoluble for applications of screen type with a low pixel size.

These miniaturization problems can be solved by using organic LEDs ("OLEDs"), which make it possible to readily associate three or four emitters of different colors in each pixel of an active-matrix screen. However, the luminance of OLEDs is too low for certain applications, such as lighting or "near the eye" projection.

It has also been proposed to produce a stack of inorganic semi-conducting layers comprising three or more LEDs, emitting at different wavelengths, that can be controlled independently of one another. In this manner, a single stack constitutes a complete pixel, in which the various sub-pixels are superposed instead of being arranged alongside one another. See in this regard U.S. Pat. No. 8,058,663. Such a structure is difficult to produce, and above all to hybridize, since it is necessary to independently interconnect several active layers situated at different depths of the stack. Moreover, the structures described by document U.S. Pat. No. 8,058,663 comprise either a plurality of tunnel junctions intended to be connected in series, or contacts taken on "stairways" etched into semi-conducting layers exhibiting a doping of type p; in both cases, relatively significant electrical resistances are obtained, inducing high losses. Furthermore, the depths to be etched are relatively significant, thus putting limits on the miniaturization achievable.

Documents US 2011/233575 and EP 2 187 442 use luminophores to perform wavelength conversions, thus making it possible to obtain various colors from one and the same electroluminescent structure. However, the thickness of the luminophore layers must be large enough (of the order of some hundred μm) to make provision to absorb the light emitted by the active layer injected electrically. Such a thickness is not compatible with a high degree of miniaturization of the pixels (lateral dimensions of the order of some ten μm) because of cross absorption of light between the various pixels.

Documents WO 2010/123814 and US 2011/0256648 teach the use of semi-conducting wavelength converters with the same aim. The structures described in these documents cannot be considered to be monolithic; their fabrication requires gluing steps which are complex to carry out.

SUMMARY OF THE INVENTION

The invention is aimed at overcoming at least some of the aforementioned drawbacks of the prior art. More precisely it is aimed at procuring:

a semi-conducting pixel structure that can be produced from inorganic semi-conductors (therefore, potentially, with high luminosity), in a simple manner, and that can be miniaturized, for example as far as a lateral size of less than or equal to 10 μm;

a matrix of such pixels, that can be used in a screen, a projector or a lighting device;

monolithic semi-conducting structures that can be used to produce such a pixel or matrix of pixels; and methods for fabricating such pixels or matrices of pixels.

In accordance with the invention, these objectives are achieved by virtue of a pixel structure comprising three adjacent sub-pixels, produced by etching on the basis of one and the same structure comprising three (light-emitting) active layers—or only two layers, a third being added subsequently. At least one, and preferably two, of these active layers are pumped electrically, the remaining layer or layers being pumped optically to operate as wavelength converter(s). Such a pixel structure can be produced based on inorganic semi-conductors and therefore exhibit a much higher luminosity than that achievable with OLEDs. With respect to the devices described in document U.S. Pat. No. 8,058,663, the hybridization is much simpler and the losses can be lesser (a single tunnel junction is necessary to make it possible to stop all the etchings on n-doped layers). Moreover, as the structure is etched on both its faces, the etching depth is reduced, thereby allowing a very high degree of miniaturization of the sub-pixels.

A subject of the invention is therefore a pixel comprising at least three sub-pixels disposed one alongside the other, each said sub-pixel comprising a respective stack of semi-conducting layers, in which:

each said sub-pixel comprises a first active layer, adapted for emitting a light at a first wavelength when an electric current passes through it;

at least one said sub-pixel, termed the first sub-pixel, also comprises a first and a second electrode arranged on either side of said first active layer so as to allow an electric current to pass through it;

another of said sub-pixels, termed the second sub-pixel, also comprises a second active layer, adapted for emitting a light at a second wavelength greater than said first wavelength;

another of said sub-pixels, termed the third sub-pixel, also comprises a third active layer, adapted for emitting a light at a third wavelength greater than said first wavelength and different from said second wavelength at least one from among said second and third active layers being adapted for emitting said light when it is excited by the light at the first wavelength emitted by said first active layer of the same sub-pixel, said pixel being characterized in that: said first active layer can is at least partially transparent to said second wavelength; said second active layer of said second sub-pixel is arranged on a first side of said first active layer and adapted for emitting said light at said second wavelength when it is traversed by an electric current, said second sub-pixel also comprising a third and a fourth electrode arranged on either side of said second active layer so as to allow an electric current to pass through it without passing through said first active layer; and said third active layer of said third sub-pixel is arranged on a second side of said first active layer, opposite to said first side, and adapted for emitting said light at said third wavelength when it is excited by the light at the first wavelength emitted by said first active layer of said third sub-pixel, said third sub-pixel also comprising a fifth and a sixth electrode arranged on either side of said first active layer so as to allow an electric current to pass through it.

According to various embodiments of such a pixel:

Said first wavelength can belong to the blue part of the visible spectrum, said second wavelength to its red part and said third wavelength to its green part.

As a variant, said first wavelength can belong to the blue part of the visible spectrum, said second wavelength to its green part and said third wavelength to its red part.

Such a pixel can exhibit a monolithic structure. Alternatively, it can exhibit a monolithic structure with the exception of said third active layer, which is then added.

Said active layers can be produced based on (Al,Ga,In)N.

Said first active layers of said sub-pixels can be coplanar, of the same composition and of the same structure.

Another subject of the invention is a matrix of pixels comprising a plurality of such pixels, hybridized on a host substrate carrying a control circuit for said sub-pixels, said first and third active layers being respectively the active layer closest to and furthest from said host substrate.

Yet another subject of the invention is a semi-conducting structure comprising a stack of semi-conducting epitaxial layers deposited on a substrate, said stack comprising, starting from said substrate: a first subset of semi-conducting layers comprising at least one photoluminescent layer, termed the third active layer, adapted for emitting a light at a wavelength termed the third wavelength, said layers exhibiting a doping of one and the same type; a second subset of semi-conducting layers forming a light-emitting diode comprising an electroluminescent layer, termed the first active layer, adapted for emitting a light at a wavelength termed the first wavelength; and a third subset of semi-conducting layers forming a light-emitting diode comprising an electroluminescent layer, termed the second active layer, adapted for emitting a light at a wavelength termed the second wavelength; said first, second and third wavelengths being mutually different and said first wavelength being less than said second and third wavelengths.

Advantageously, in such a structure said first subset of semi-conducting layers can exhibit a doping of type n and in which a tunnel junction is interposed between said second subset and said third subset of semi-conducting layers.

Yet another subject of the invention is a method for fabricating a pixel comprising the following steps:

a) procuring a semi-conducting structure such as mentioned hereinabove;

b) etching said structure so as to define a first, a second and a third pads intended to form respective sub-pixels, by means of an etching extending at least through said first and second active layers;

c) etching said first pad and said third pad, but not said second pad, so as to remove said second active layer therefrom;

d) producing a pair of electrical contacts situated on either side of said second active layer of said third, and two pairs of electrical contacts situated on either side of said first active layer of said first and second pads;

e) removing said substrate; and f) etching the structure so as to remove said third active layer in correspondence with said first and second pads, but not with said third pad.

Yet another subject of the invention is a method for fabricating a pixel, comprising the following steps:

a') procuring a semi-conducting structure comprising: a first subset of semi-conducting layers forming a light-emitting diode comprising an electroluminescent layer, termed the first active layer, adapted for emitting a light at a wavelength termed the first wavelength; and a second subset of semi-conducting layers forming a light-emitting diode comprising an electroluminescent layer, termed the second active layer (52'), adapted for emitting a light at a wavelength termed the second wavelength, greater than said first wavelength;

b) etching said structure so as to define a first, a second and a third pads intended to form respective sub-pixels, by means of an etching extending through said first and second active layers;

c) etching said first pad and said third pad, but not said second pad, so as to remove said second active layer therefrom;

d) producing a pair of electrical contacts situated on either side of said second active layer of said third, and two pairs of electrical contacts situated on either side of said first active layer of said first and second pads;

e) removing said substrate; and f') either adding, in place of said substrate, a photoluminescent layer termed the third active layer adapted for emitting a light at a third wavelength when it is excited by a light at said first wavelength, and then removing by etching said third active layer in correspondence with said first and second pads; or adding said third active layer in correspondence with said third pad and with the exclusion of said first and second pads.

In a general manner, one understands by:
 "light" or "luminous radiation" an electromagnetic radiation of wavelength lying between 380 and 780 nm.
 "blue light" or "blue radiation" an electromagnetic radiation of wavelength lying between 380 and 490 nm, and preferably between 430 nm and 470 nm;
 "green light" or "green radiation" an electromagnetic radiation of wavelength lying between 500 nm and 560 nm, and preferably between 510 nm and 530 nm;
 "red light" or "red radiation" an electromagnetic radiation of wavelength lying between 600 and 780 nm, and preferably between 610 nm and 640 nm;
 "partially transparent layer" a layer exhibiting a transmittance of greater than or equal to 25%, more advantageously of greater than or equal to 50%, preferably of greater than or equal to 75%, in a yet more preferred manner of greater than or equal to 90%, or indeed than 95%.

BRIEF DESCRIPTION OF THE DRAWINGS

Other characteristics, details and advantages of the invention will emerge on reading the description given with reference to the appended drawings given by way of example and which represent, respectively:

FIG. 3, a lateral view of a matrix of semi-conducting pixels according to said first embodiment.

DETAILED DESCRIPTION

Figure 1A:
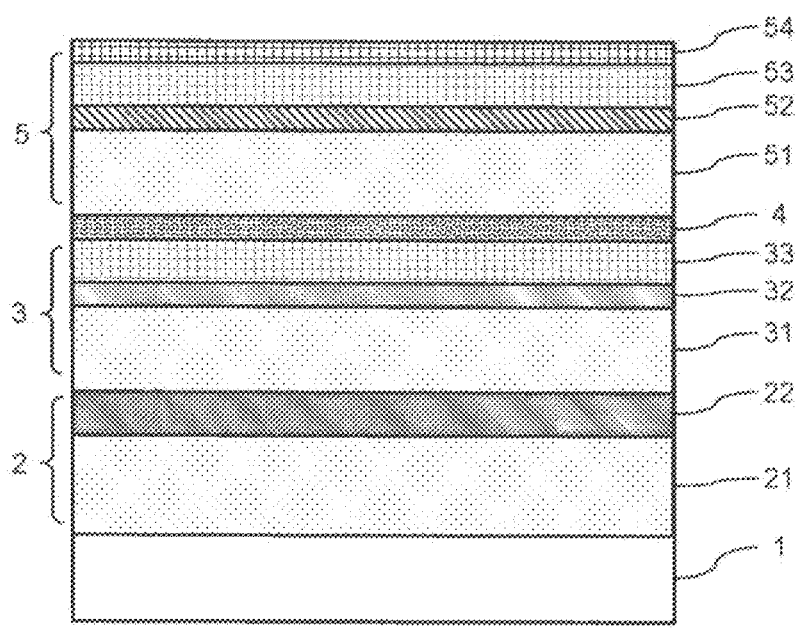
FIGS. 1A-1E, the various steps of a method for fabricating a semi-conducting pixel according to a first embodiment of the invention.

FIG. 1A shows an epitaxial monolithic structure that can be used as starting point for a method for fabricating a semi-conducting pixel according to a first embodiment of the invention. This structure comprises, from the bottom:

A substrate 1, made for example of sapphire; this substrate will be eliminated in the course of the fabrication method, consequently its nature is of only little importance, provided that it allows the epitaxial growth of the other layers constituting the structure. Thus in place of sapphire it would be possible to use, for example, a substrate made of Si, SiC or ZnO.

A first subset of semi-conducting layers 2 comprising, in order, a layer 21 of type n doped GaN, for example of thickness equal to 2 µm, having solely an electrical conduction function, and an "active" (that is to say light-emitting) layer 22 comprising a stack of quantum wells (Ga,In)N/(Al,Ga,In)N, also exhibiting a doping of type n or not intentionally doped and able to emit a green luminous radiation when it is excited by a blue luminous radiation. The active layer can comprise, for example, 50 $In_{0.25}Ga_{0.75}N$ (2 nm)/GaN (10 nm) periods.

A second subset of semi-conducting layers 3 forming a light-emitting diode and comprising a layer 31 of n-doped GaN (for example of thickness equal to 1 µm), an "active" layer 32 comprising a stack of quantum wells (Ga,In)N/(Al,Ga,In)N, n-doped or not intentionally doped, (for example comprising 5 $In_{0.15}Ga_{0.85}N$ (2 nm)/GaN (10 nm) periods) able to emit a blue radiation when it is electrically pumped and another layer 33 of p-doped GaN (for example, of thickness equal to 200 nm), so as to form a p-n junction.

A tunnel junction 4 (p++/n++, for example of thickness equal to 50 nm).

A third subset of semi-conducting layers 5 forming a light-emitting diode and comprising a layer 51 of n-doped GaN (1 µm), an "active" layer 52 comprising a stack of quantum wells (Ga,In)N/(Al,Ga,In)N, n-doped or not intentionally doped, (for example, 5 $In_{0.40}Ga_{0.60}N$ (2 nm)/GaN (10 nm) periods) able to emit a red radiation when it is electrically pumped, another layer 53 of p-doped GaN (200 nm), so as to form a p-n junction and a p++ doped contact layer 54 (20 nm). It will be noted that the tunnel junction 4 makes it possible to prevent the layers 33 and 51 from forming a parasitic p-n junction that would be reverse biased when the diodes 3 and 5 are forward biased. In principle, it would be possible to modify the structure so as not to use a tunnel junction, but this would make it compulsory to stop etching steps on p-doped layers, this not being desirable for technological reasons.

As will be explained further on, the layers 31 and 51 will serve as etching stopping layers; they will therefore be, in general, thicker than the other layers of the structure.

In principle, it would be possible to reverse the doping of all the layers of FIG. 1A, but this would not be advantageous since p-doped GaN is substantially more resistive than n-doped GaN.

In accordance with the invention, the structure of FIG. 1A is thereafter processed through conventional steps of photolithography and evaporation of metals, as will be explained in detail with the aid of FIGS. 1B-1E.

Figure 1B:
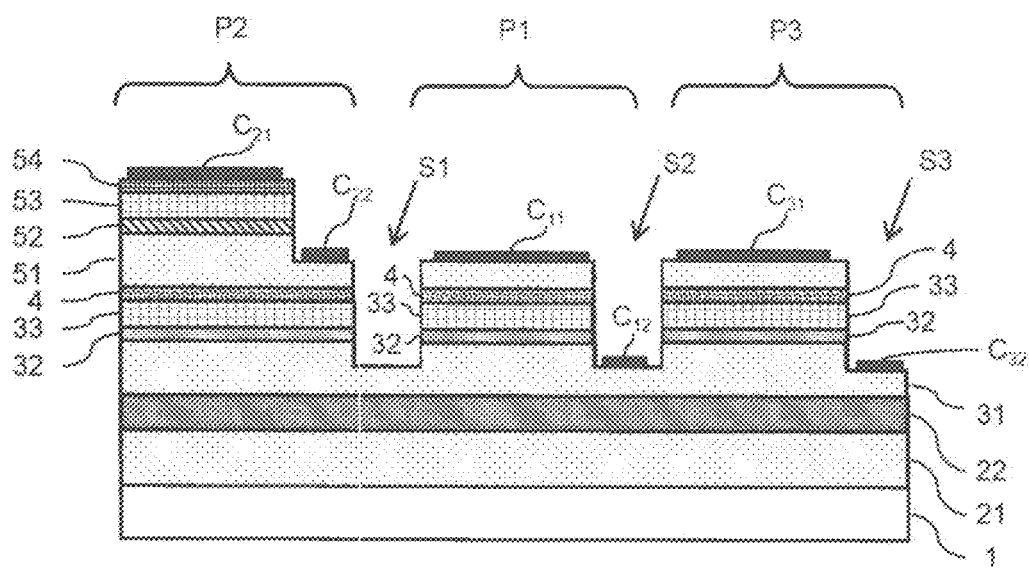

FIG. 1B shows the structure after:

A first etching step defining three pads P1, P2 and P3, intended to form respective sub-pixels, separated by two furrows S1 and S2 which extend, depthwise, as far as the layer 31; a third furrow S3 of the same depth is etched on the side of the pad P3. It is important that these furrows pass through at least the active layers 32 and 52, but not the entirety of the structure as far as the substrate.

A second etching step, removing the layers 52, 53, 54, and a part of the layer 51, pads P1 and P3, and producing a "stairway" at the level of the layer 52 of the pad P2.

A metallic deposition step producing electrical contacts at the vertex of the pads P1, P2 and P3, at the bottom of the furrows S2 and S3 and on the aforementioned "stairway". These electrical contacts are identified by the references $C_{11}$, $C_{12}$, $C_{21}$, $C_{22}$, $C_{31}$, $C_{32}$.

Figure 1C:
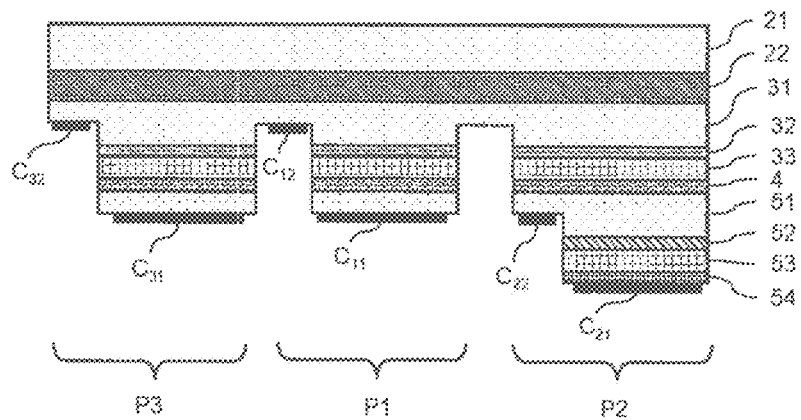

Thereafter, the structure is inverted and the substrate removed (FIG. 1C).

Figure 1D:
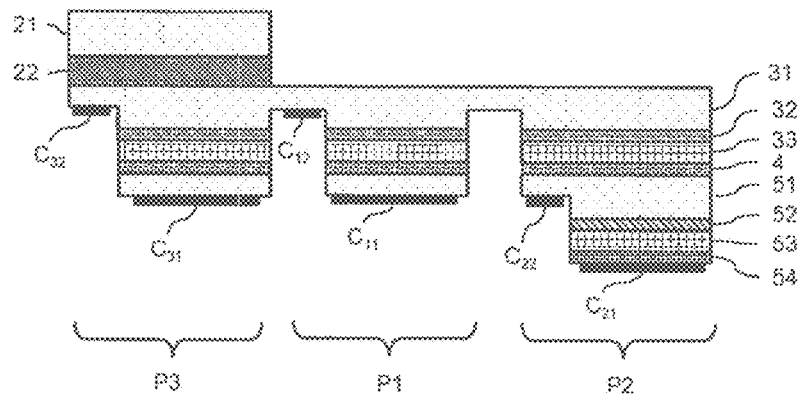

There follows a step of "rear face" etching, which removes the layer 21 and the active "green" layer 22 of the pads P1 and P2, but not of the pad P3 (FIG. 1D).

The order in which certain steps are implemented can be modified. For example, the electrical contacts can be deposited before or after the removal of the substrate and the etching of the green active layer.

Figure 1E:
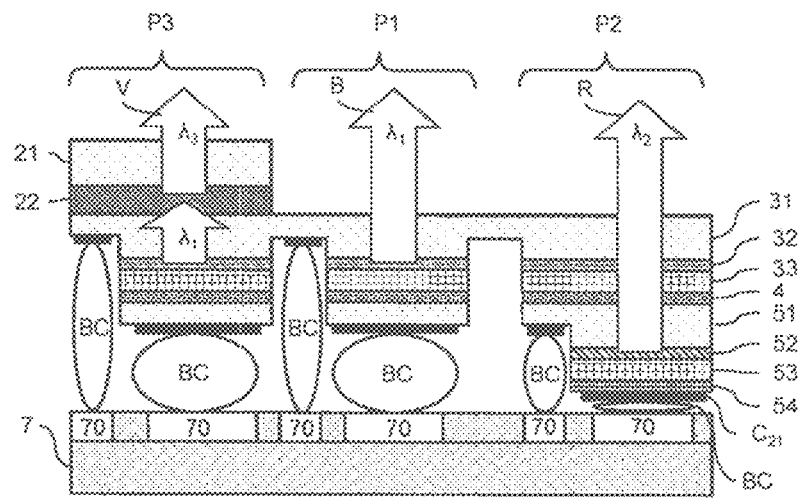

The pixel structure P thus obtained is hybridized on a substrate 7 carrying a drive circuit for the pixel by means of contact balls BC, generally made of indium (FIG. 1E). The substrate 7 can consist of a printed circuit, or indeed an integrated circuit; the reference 70 identifies conducting tracks of the drive circuit.

The contacts $C_{11}$, $C_{12}$ form electrodes making it possible to forward bias the blue light-emitting diode 3 of the pad P1, which thus forms a "blue" sub-pixel, emitting a light B at a first wavelength $\lambda_1$.

The contacts $C_{21}$, $C_{22}$ form electrodes making it possible to forward bias the red light-emitting diode 5 of the pad P2, which thus forms a "red" sub-pixel emitting a light R at a second wavelength $\lambda_2 > \lambda_1$. It should be noted that the whole of the stack of semi-conducting layers situated above the active layer 52 is transparent to red light.

The contacts $C_{31}$, $C_{32}$ form electrodes making it possible to forward bias the blue light-emitting diode 3 of the pad P3; the blue light emitted by the active layer 32 optically pumps the active layer 22, which re-emits a green light V, at a third wavelength $\lambda_3 > \lambda_1$. The pad P3 thus forms a "green" sub-pixel.

The three sub-pixels can therefore be driven independently, to form a pixel of "red-green-blue" (RGB) type. In a known manner, it is possible to produce pixels comprising more than three sub-pixels. The latter can exhibit any shape and any arrangement known in the art.

The method has been described with reference to the fabrication of a single isolated pixel, but it is readily generalized to the fabrication of a matrix of pixels, which matrix is optionally monolithic, able to serve for the production of a display screen. FIG. 3 shows a lateral view of such a matrix.

Although the term "pixel" suggests a display application, an optoelectronic device of the type illustrated in FIG. 1E can also serve as variable-color lighting element whose active area can be of the order of one $mm^2$, typical of inorganic white LEDs.

The structure of FIG. 1A presents, starting from the substrate, a "green" active layer 22 (emitting a green light), a "blue" active layer 32 and a "red" active layer 52. In principle it would be possible to envisage swapping the positions of the green and blue active layers, but this would lead to pumping a red emitter with a green light, which cannot be carried out in an effective manner, in any event not with materials of the (Al,Ga,In)N family on account of the low absorption of green light by quantum wells (Ga,In)N/(Al,Ga,In)N emitting in the red.

It is also possible to swap the positions of the red and green active layers. However, in this case it is not advised to produce a monolithic structure based on (Ga,In)N/(Al,Ga,In)N. Indeed it is known that red emitters made of (Ga,In)N/(Al,Ga,In)N are very temperature sensitive. Depositing such an emitter before the blue and green active layers would risk damaging it. Consequently, it is preferable to use an added wavelength converter, emitting in the red. To be able to miniaturize the pixel it is preferable to use, as converter, a semi-conductor such as (Al,Ga,In)P rather than a phosphor, which ought to be relatively thick (of the order of 100 μm to ensure good absorption of the excitation light).

FIGS. 2A-2E illustrate the fabrication of a pixel according to a second embodiment of the invention, comprising an added wavelength converter, emitting in the red.

Figure 2A:
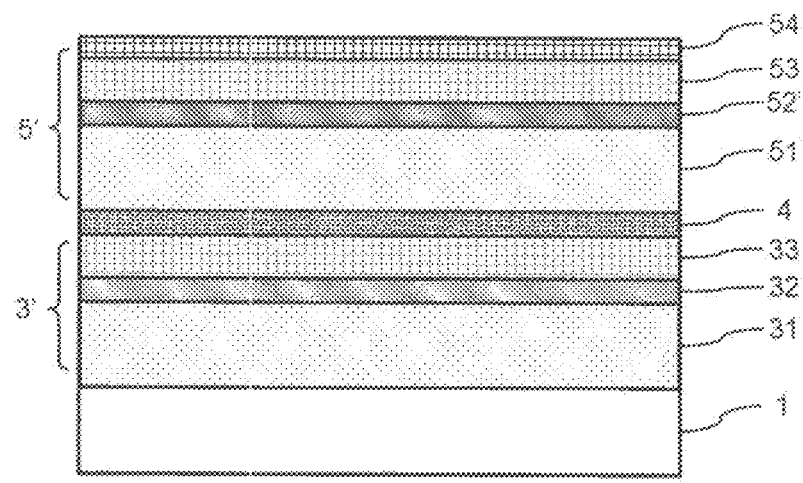
FIGS. 2A-2E, the various steps of a method for fabricating a semi-conducting pixel according to a second embodiment of the invention.
Figure 2B:
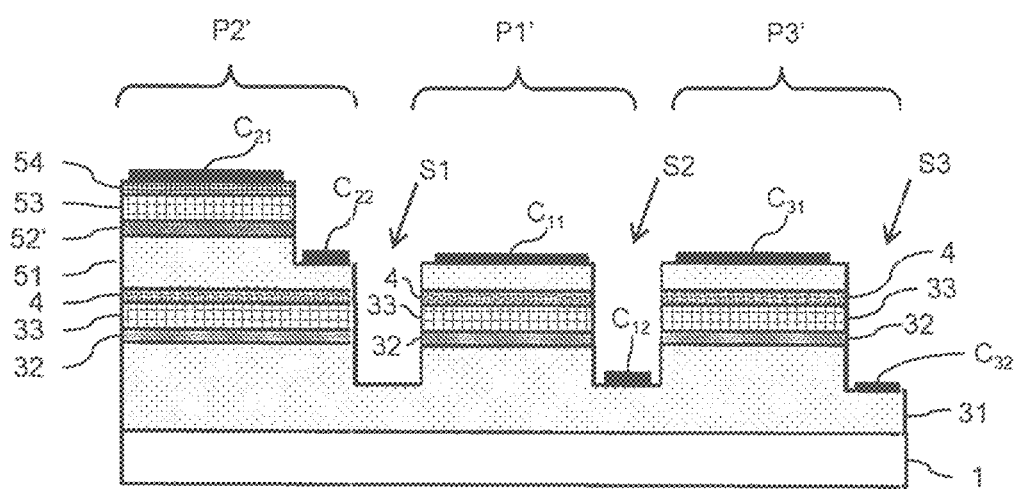
Figure 2C:
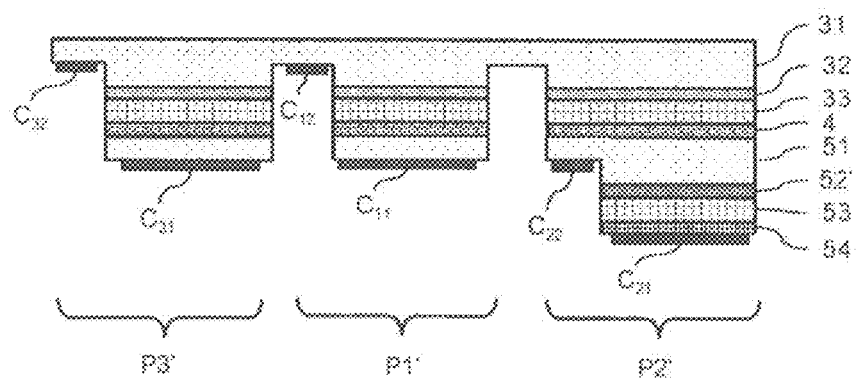

The starting point of such a method (FIG. 2A) is a structure similar to that of FIG. 1A but not comprising the layers 21 and 22; in this structure, the layer 31 is deposited directly on the substrate. Furthermore, the active layer furthest from the substrate (reference 52') is adapted for emitting a green radiation, instead of a red radiation like the active layer 52 of FIGS. 1A-1E. In FIG. 2A, the reference 3' identifies a first stack of semi-conducting layers, comprising the layers 31, 32 and 33, and substantially identical to the second stack 3 of FIG. 1A; the reference 5' identifies a second stack of semi-conducting layers comprising the layers 51, 52', 53 and 54.

Figure 2D:
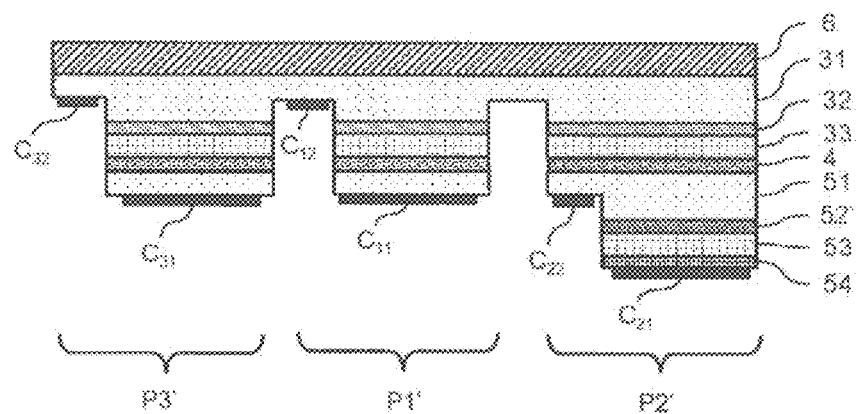
Figure 2E:
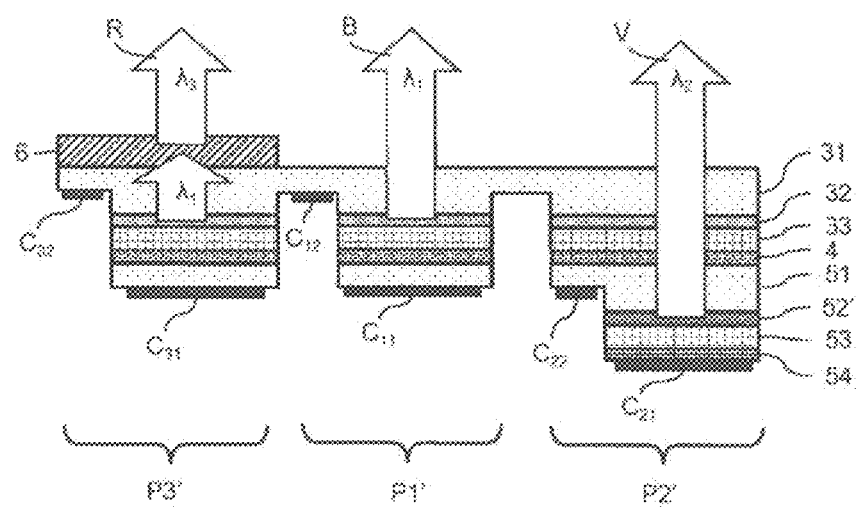

The first steps of etching (FIG. 2B), inversion and elimination of the substrate (FIG. 2C) are substantially identical to the corresponding steps of the above-described method; the three pads are identified by the references P1', P2' and P3' to distinguish them from those of the first embodiment. Thereafter, as illustrated in FIG. 2D, the method comprises a step consisting in adding (for example by gluing) a wavelength converter emitting in the red (reference 6)—for example based on (Al,Ga,In)P—and an etching step to eliminate this converter except in correspondence with the third pad P3'. As a variant, it would be possible to add the converter 6 only in correspondence with said third pad, but in practice this would be very difficult.

The step of hybridization on a substrate carrying a control circuit, not represented, is done as in the case of the first embodiment.

The order in which certain steps are implemented can be modified. For example, the electrical contacts can be deposited before or after the removal of the substrate and the gluing of the wavelength converter.

An added wavelength converter (green, in this case) could also be used in the embodiment of FIG. 1E. In this case, the converter could advantageously be produced from a type II-VI semi-conductor.

The invention has been described with reference to a certain number of embodiments, essentially using materials of the (Al,Ga,In)N family; however, the use of other semi-conducting materials, especially inorganic, can be envisaged without departing from the field of the invention. The use, in the active layers, of quantum confinement structures (quantum wells or dots) is advantageous but not essential. Moreover, as a function of the envisaged application, a device according to the invention can comprise more than three active layers. Furthermore, above all in applications other than display (lighting, for example), said active layers can emit radiations of colors other than red, green and blue.

The values and compositions indicated hereinabove are given solely by way of nonlimiting examples.

The invention claimed is:

1. A semiconductor configured to implement at least one pixel, the at least one pixel comprising at least three sub-pixels disposed one alongside the other, each said sub-pixel comprising a respective stack of semi-conducting layers, wherein:

each said sub-pixel comprises a first active layer configured to emit a light at a first wavelength when an electric current passes through it;

at least one said sub-pixel defining a first sub-pixel, the first sub-pixel also comprises a first and a second electrode arranged on different sides of said first active layer so as to allow an electric current to pass through it;

another at least one said sub-pixel defining a second sub-pixel, the second sub-pixel also comprises a second active layer configured to emit a light at a second wavelength greater than said first wavelength;

another at least one said sub-pixel defining a third sub-pixel, the third sub-pixel also comprises a third active layer configured to emit a light at a third wavelength greater than said first wavelength and different from said second wavelength;

at least one of said second and third active layers being configured to emit a light when it is excited by the light at the first wavelength emitted by said first active layer of the same sub-pixel wherein:

said first active layer is at least partially transparent to said second wavelength;

said second active layer of said second sub-pixel is arranged on a first side of said first active layer and configured to emit said light at said second wavelength when it is traversed by an electric current, said second sub-pixel also comprising a third and a fourth electrode arranged on different sides of said second active layer so as to allow an electric current to pass through it without passing through said first active layer; and said third active layer of said third sub-pixel is arranged on a second side of said first active layer, opposite to said first side, and configured to emit said light at said third wavelength when it is excited by the light at the first wavelength emitted by said first active layer of said third sub-pixel, said third sub-pixel also comprising a fifth and a sixth electrode arranged on different sides of said first active layer so as to allow an electric current to pass through it.

2. The semiconductor configured to implement at least one pixel as claimed in claim 1, wherein said first wavelength belongs to the blue part of the visible spectrum, said second wavelength to its red part, and said third wavelength to its green part.

3. The semiconductor configured to implement at least one pixel as claimed in claim 1, wherein said first wavelength belongs to the blue part of the visible spectrum, said second wavelength to its green part, and said third wavelength to its red part.

4. The semiconductor configured to implement at least one pixel as claimed in claim 1 comprising a monolithic structure.

5. The semiconductor configured to implement at least one pixel as claimed in claim 3, comprising a monolithic structure with the exception of said third active layer, which is added.

6. The semiconductor configured to implement at least one pixel as claimed in claim 1, wherein said active layers are produced based on (Al,Ga,In)N.

7. The semiconductor configured to implement at least one pixel as claimed in claim 1, wherein said first active layers of said sub-pixels are coplanar, of the same composition and of the same structure.

8. A semiconductor configured to implement a matrix of pixels comprising a plurality of pixels according to claim 1, hybridized on a host substrate carrying a control circuit for said sub-pixels, said first and third active layers being respectively the active layer closest to and furthest from said host substrate.

9. A method for fabricating a semiconductor configured to implement at least one pixel comprising at least three sub-pixels disposed one alongside the other, each said sub-pixel comprising a respective stack of semi-conducting layers, wherein:

each said sub-pixel comprises a first active layer configured to emit a light at a first wavelength when an electric current passes through it;

at least one said sub-pixel defining a first sub-pixel, also comprises a first and a second electrode arranged on different sides of said first active layer so as to allow an electric current to pass through it;

another at least one said sub-pixel defining a second sub-pixel, also comprises a second active layer configured to emit a light at a second wavelength greater than said first wavelength;

another at least one said sub-pixel defining a third sub-pixel, also comprises a third active layer configured to emit a light at a third wavelength greater than said first wavelength and different from said second wavelength;

at least one from among said second and third active layers being configured to emit a light when it is excited by the light at the first wavelength emitted by said first active layer of the same sub-pixel wherein:

said first active layer is at least partially transparent to said second wavelength;

said second active layer of said second sub-pixel is arranged on a first side of said first active layer and configured to emit a light at said second wavelength when it is traversed by an electric current, said second sub-pixel also comprising a third and a fourth electrode arranged on different sides of said second active layer so as to allow an electric current to pass through it without passing through said first active layer; and said third active layer of said third sub-pixel is arranged on a second side of said first active layer, opposite to said first side, and configured to emit a light at said third wavelength when it is excited by the light at the first wavelength emitted by said first active layer of said third sub-pixel, said third sub-pixel also comprising a fifth and a sixth electrode arranged on different sides of said first active layer so as to allow an electric current to pass through it, the method comprising the following steps:

a) procuring a semi-conducting structure comprising a stack of semi-conducting epitaxial layers deposited on a substrate, said stack comprising, starting from said substrate: a first subset of semi-conducting layers comprising at least one photoluminescent layer defining a third active layer configured to emit a light at a third wavelength, said layers exhibiting a doping of one and the same type; a second subset of semi-conducting layers forming a light-emitting diode comprising an electroluminescent layer defining a first active layer configured to emit a light at a first wavelength; and a third subset of semi-conducting layers forming a light-emitting diode comprising an electroluminescent layer defining a second active layer configured to emit a light at a second wavelength; said first, second and third wavelengths being mutually different and said first wavelength being less than said second and third wavelengths;

b) etching said structure to define a first, a second and a third pads to form respective sub-pixels, the etching extending at least through said first and second active layers;

c) etching said first pad and said third pad, but not said second pad, so as to remove said second active layer therefrom;

d) producing a pair of electrical contacts situated on different sides of said second active layer of said third, and two pairs of electrical contacts situated on different sides of said first active layer of said first and second pads;

e) removing said substrate; and f) etching the structure so as to remove said third active layer in correspondence with said first and second pads, but not with said third pad.

10. A method for fabricating a semiconductor configured to implement at least one pixel as claimed in claim 5, comprising the following steps:

a') procuring a semi-conducting structure comprising: a first subset of semi-conducting layers forming a light-emitting diode comprising an electroluminescent layer defining a first active layer configured to emit a light at a first wavelength; and a second subset of semi-conducting layers forming a light-emitting diode comprising an electroluminescent layer defining a second active layer configured to emit a light at a second wavelength, greater than said first wavelength;

b) etching said structure to define a first, a second and a third pads intended to form respective sub-pixels, the etching extending through said first and second active layers;

c) etching said first pad and said third pad, but not said second pad, so as to remove said second active layer therefrom;

d) producing a pair of electrical contacts situated on different sides of said second active layer of said second, and two pairs of electrical contacts situated on different sides of said first active layer of said first and third pads;
e) removing said substrate; and
f) adding one of the following:
adding in place of said substrate, a photoluminescent layer defining the third active layer configured to emit a light at a third wavelength when it is excited by a light at said first wavelength, and then removing by etching said third active layer in correspondence with said first and second pads; or
adding said third active layer in correspondence with said third pad and with the exclusion of said first and second pads.

* * * * *